United States Patent
Rose

[11] 4,008,683
[45] Feb. 22, 1977

[54] MACHINE FOR TREATING WAFER-FORM ITEMS

[75] Inventor: Peter H. Rose, Rockport, Mass.

[73] Assignee: Varian Associates, Palo Alto, Calif.

[22] Filed: Apr. 7, 1975

[21] Appl. No.: 565,862

Related U.S. Application Data

[63] Continuation-in-part of Ser. No. 379,346, July 16, 1973, abandoned.

[52] U.S. Cl. .................................. 118/49.1; 193/32
[51] Int. Cl.² ......................................... C23C 13/08
[58] Field of Search ........................... 118/48–50.1; 219/275; 34/242; 250/441, 289; 193/32

[56] References Cited
UNITED STATES PATENTS

| | | | |
|---|---|---|---|
| 2,618,750 | 11/1952 | Parsegian et al. | 250/289 |
| 3,400,265 | 9/1968 | Houbart | 250/441 |
| 3,568,632 | 3/1971 | Cawthon | 118/49 |
| 3,714,925 | 2/1973 | Helm | 118/49 |
| 3,901,183 | 8/1975 | Wittkower | 118/49.1 |

*Primary Examiner* — Morris Kaplan

[57] ABSTRACT

A machine which processes discrete wafer-form items in a chamber is provided with a slot-form channel along which the items move between points inside and outside the chamber, a lateral opening exposing the channel from its side, exposed walls of the channel defining a sealing margin directed toward that opening. A resilient sealing member is movable through the opening between an open position, in which the channel is not obstructed, and a sealing position, in which the sealing member resiliently engages the sealing margin. The machine shown is an ion implanter in which a beam of ions strikes the exposed item in the chamber. Features include a channel which makes an angle with the horizontal for gravity movement of the items; the sealing member serving as a stop to position an item along the length of the channel; and a plurality of openings and associated sealing members to provide locks on the sides of the chamber. The sealing member, preferably of cylindrical form, comprises an elongated resilient element disposed in the direction of the width of the slot and having a corresponding dimension greater than the thickness of the slot.

9 Claims, 20 Drawing Figures

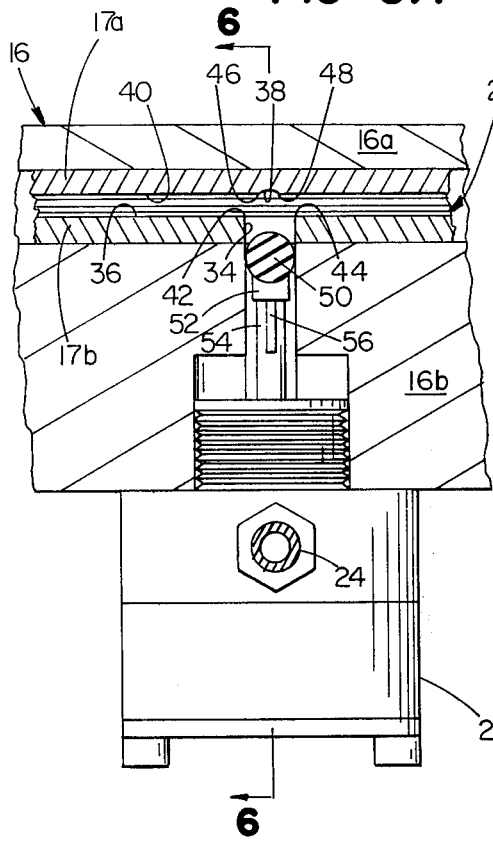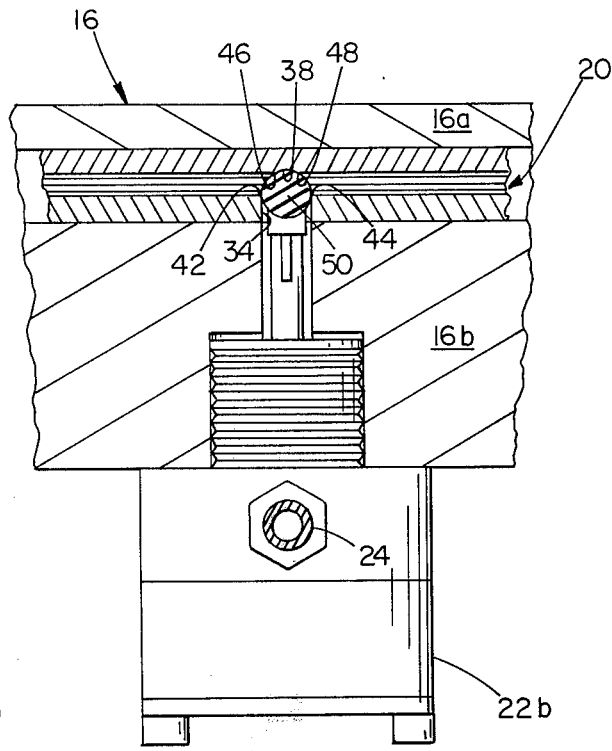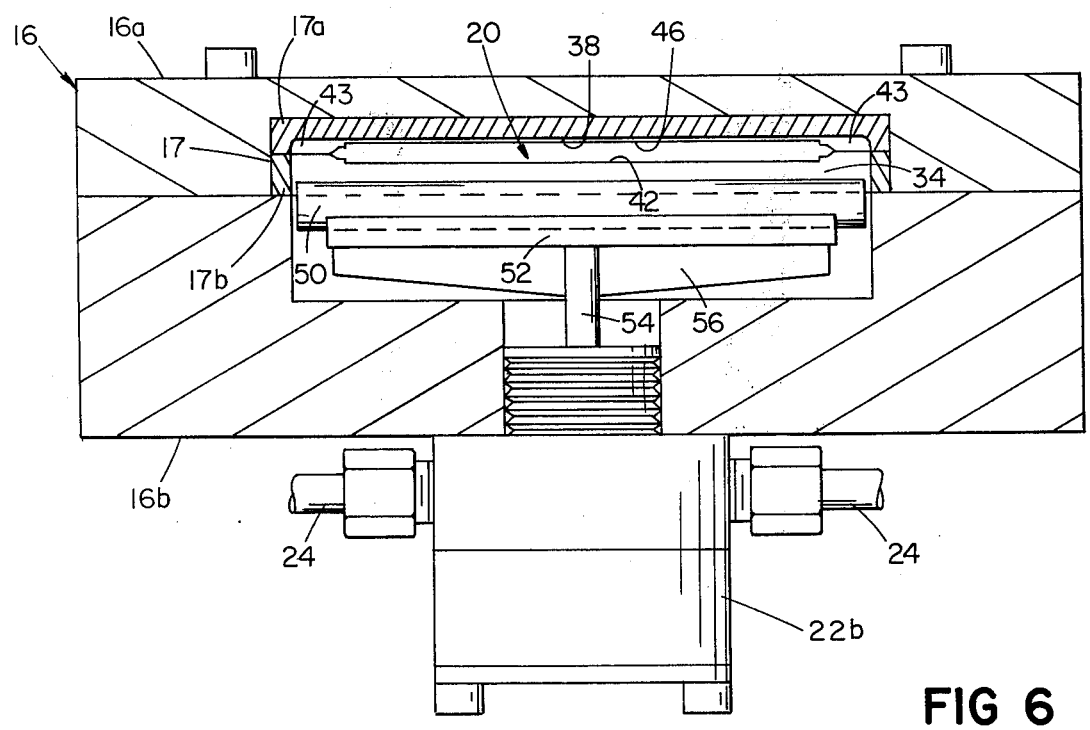

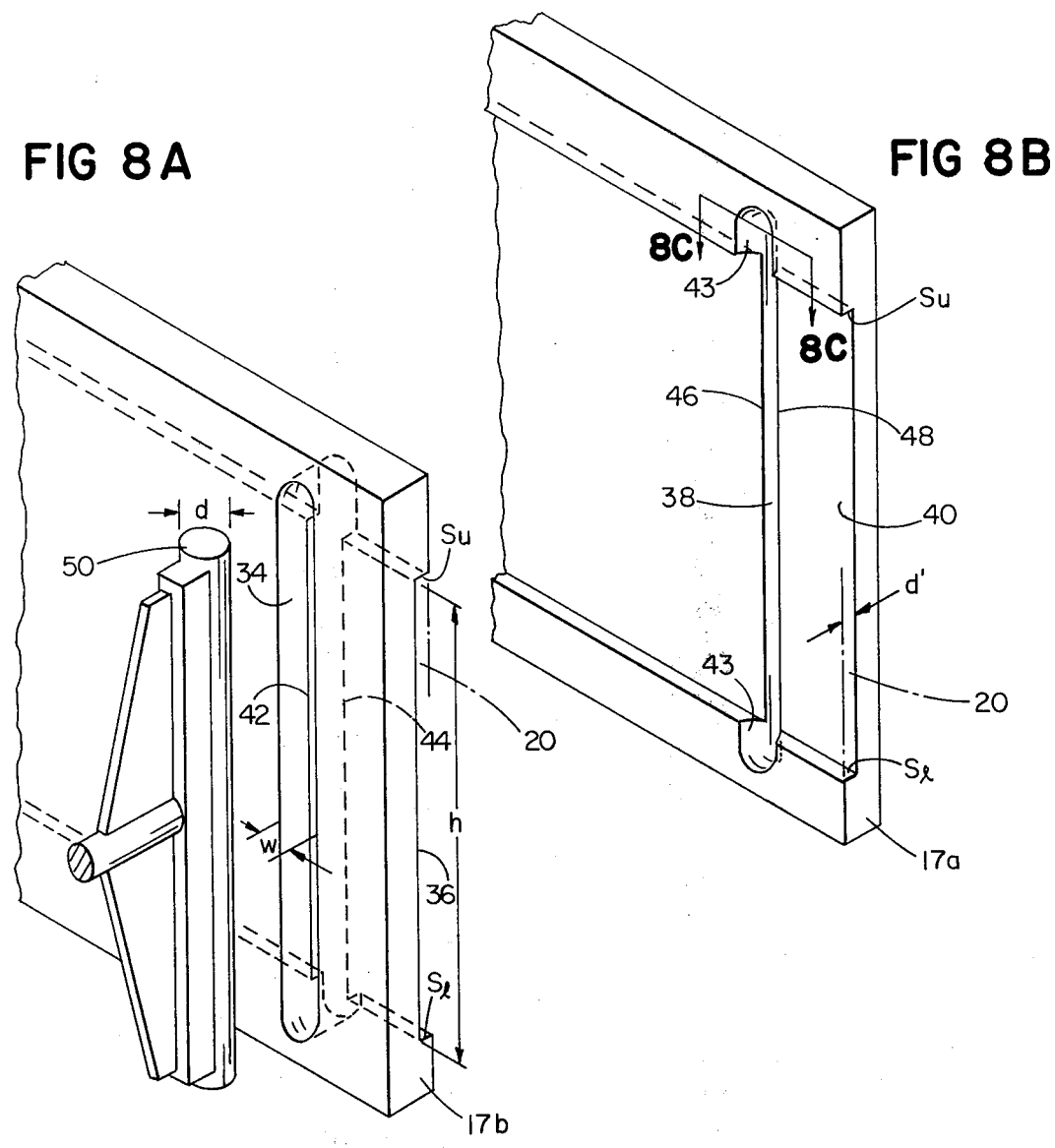
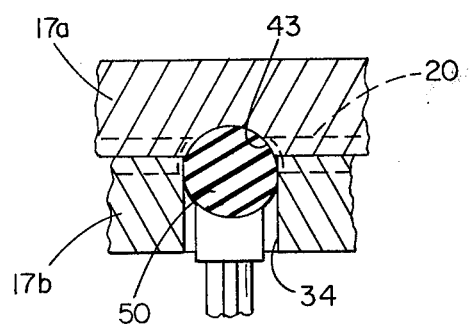

MACHINE FOR TREATING WAFER-FORM ITEMS

CROSS-REFERENCE TO RELATED APPLICATION

This is a continuation-in-part of copending U.S. patent application Ser. No. 379,346, filed July 16, 1973, now abandoned, for "Machine For Treatment of Discrete Items."

BACKGROUND OF THE INVENTION

This invention relates to improvements in apparatus for processing discrete wafer-form items in a vacuum. The improvements are of special importance to machines which expose such items to beams, and, in particular, to machines for the implantation of ions in semi-conductor wafers.

SUMMARY OF THE INVENTION

It is a principal object of the present invention to provide improvements in such apparatus which assist in increasing the production rate and in rendering the processing of the items more susceptible to automation.

The invention concerns, in general, a machine for treating discrete water-form items in a vacuum, the machine including a target station for exposing a succession of the wafer-form items to a treatment beam and a lock system for introducing and removing the items relative to the target station. According to one aspect of the invention, entry and exit locks and the target station are defined by successive portions of an elongated slot-shaped channel through which the items proceed edgewise, the channel having an elongated cross-section throughout its length larger in each dimension than the cross-section of the wafer-form items, thereby enabling edgewise movement of the wafer-form items to successive positions along the channel while providing a small channel volume to be evacuated. A plurality of spaced apart seals movable between open and closed positions are each sized in the closed position to span the slot-shaped channel for sealing one part of the channel from another and these are arranged to define entry and exit locks, the target station located therebetween.

According to another aspect of the invention, an elongated slot-shaped channel either forming an entry lock, an exit lock, or the combination with a target station, is disposed with its axis at an angle to the horizontal to cause the wafer-form items to proceed edgewise therethrough by gravity movement. In one embodiment the channel is sloped to the horizontal while in another the channel forms a right angle thereto, in either case achieving the desired gravity movement.

In preferred embodiments the machine comprises an ion implanter for the wafer-form items, the machine including means for producing an ion beam directed to a target station formed by the channel, the axis of the beam set at an angle slightly off-set from perpendicular to the plane of the slot-shaped channel thereby to cause ions to strike the wafer-form items at a corresponding angle as is known to be desired; the channel is formed by a pair of mating plates, the mating face of at least one of the plates having formed therein an elongated slot-form depression; a seal comprises a resilient member sized in closed position to span the slot-shaped channel and resiliently seal against exposed surfaces bounding the channel, preferably the seal comprising an elongated resilient member having a length at least as long as the widest dimension of the transverse cross-section of the slot-form channel, the seal member disposed to move through an opening of corresponding dimension in one wide wall bounding the channel to squeeze against the opposed wall of the channel, thus to close the channel; at least one of the seals comprises, in its closed position, a stop for obstructing the gravity movement of a wafer-form item, and effective when opened to release the wafer-form item for further gravity movement along said channel and preferably this seal and stop comprising an elastomeric member.

BRIEF DESCRIPTION OF THE DRAWINGS

Other objects, features, and advantages of the invention will appear from the following description of particular preferred embodiments, which are illustrated in the accompanying drawings. In the drawings:

FIGS. 5A and 5B are transverse sectional views of a vacuum seal constructed according to the invention showing the seal in, respectively, open and closed positions;

FIG. 6 is a view taken at 6—6 of FIG. 5A;

FIGS. 8A and 8B are perspective views of parts of the seal assembly; and

FIG. 8C is a view taken at 8C—8C of FIG. 8B.

DETAILED DESCRIPTION OF PARTICULAR PREFERRED EMBODIMENTS

Figure 1:
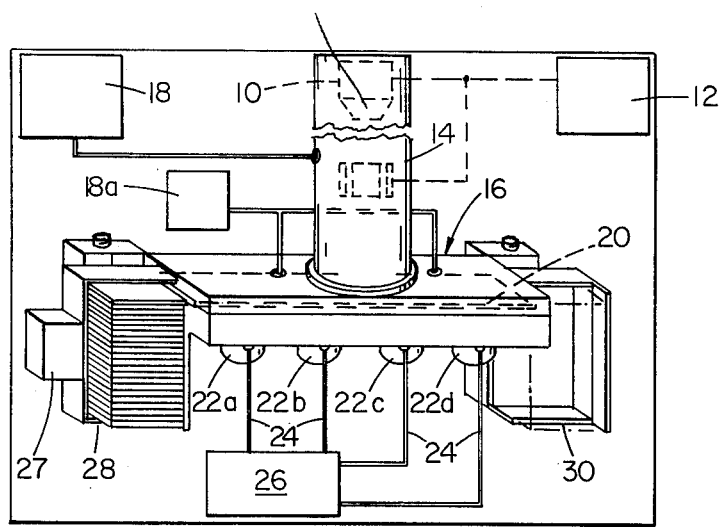
FIG. 1 is a partially schematic plan view of an ion implantation machine for processing wafer-form items in a vacuum.

Referring to FIGS. 1–4, the machine for implanting ions in semiconductor wafers has an ion source 10 and an ion scanning control 12 for producing at predetermined times an ion beam which travels through a tube 14 toward a target unit 16. Tube 14 and the portions of the unit 16 with which it communicates (described below) are evacuated to a predetermined pressure by vacuum pump 18.

Figure 2:
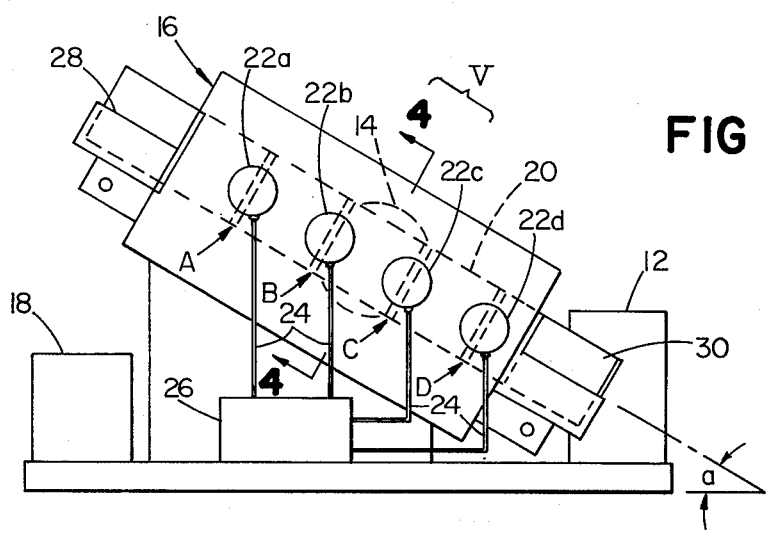
FIG. 2 is a partially schematic end view of the machine of FIG. 1.
Figure 3:
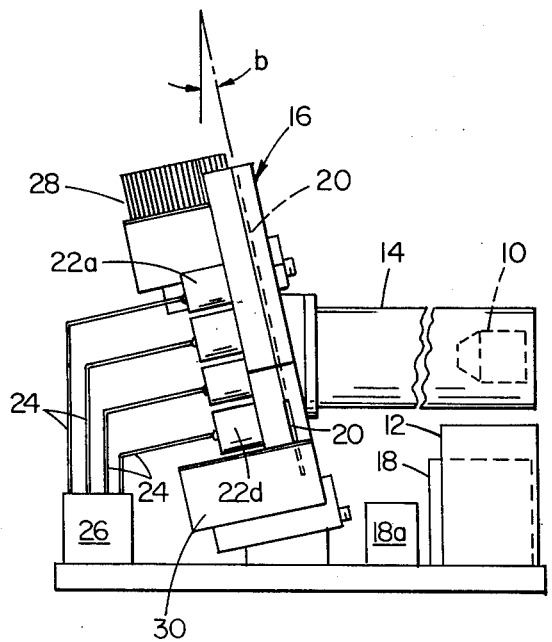
FIG. 3 is a partially schematic side view of the machine of FIG. 1.
Figure 4:
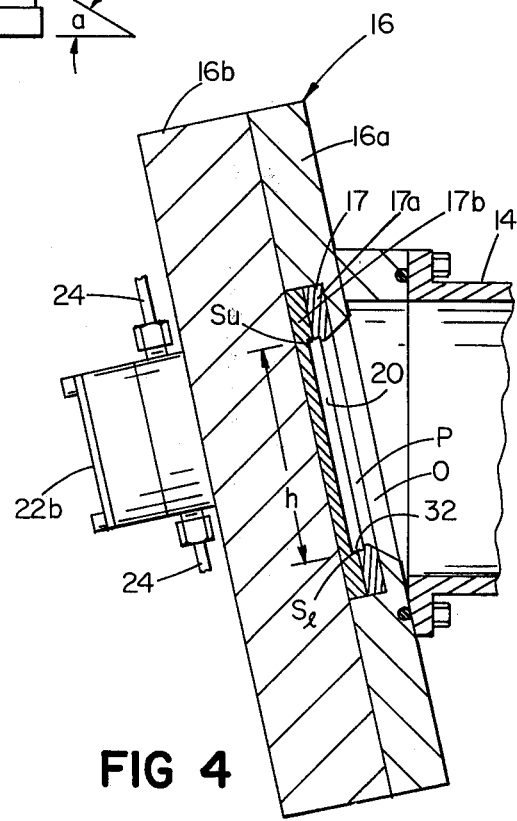
FIG. 4 is a view taken at 4—4 of FIG. 2.
Figure 2A:
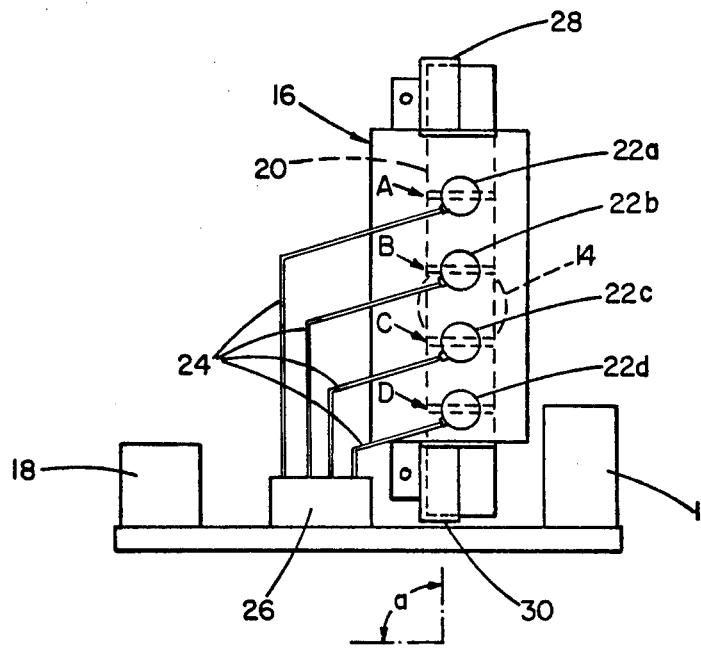
FIG. 2A is an end view similar to FIG. 2, of an alternative embodiment.

The target unit 16 is formed by a pair of face-to-face plates 16a, 16b, the latter having a milled channel 17 containing two further plate members 17a, 17b, which together define an elongated internal slot 20 (best seen in FIG. 4). The portion of slot 20 in the central region of unit 16 communicates through openings O and P in plates 16a and 17a, respectively, with the interior of tube 14 and defines the vacuum chamber in which treatment (i.e., implantation of ions) of the wafer-form items takes place. The portions of the slot 20 to the sides of that central region define access channels to and from vacuum chamber. The unit 16 is mounted with the axis of the channel at an angle $a$ with respect to the horizontal to produce gravity movement of the wafer-form items. In the embodiment of FIG. 2 angle $a$ is about 25° and in the embodiment of FIG. 2a angle $a$ is 90°. As best seen in FIGS. 3 and 4, the unit 16 is mounted with the widest transverse dimension of the slot at an angle, $b$, of approximately 7° with respect to the vertical. At four spaced apart locations along the length of slot 20, vacuum barriers or seals are provided. (These are indicated generally at A-D in FIGS. 2 and 2A and are described below in relation to FIGS. 5A, 5B, and 6.) Bellows units 22a–d drive the seals A-D and are themselves actuated by compressed air delivered through lines 24 from a compressed air supply and sequencing unit 26.

Figure 3A:
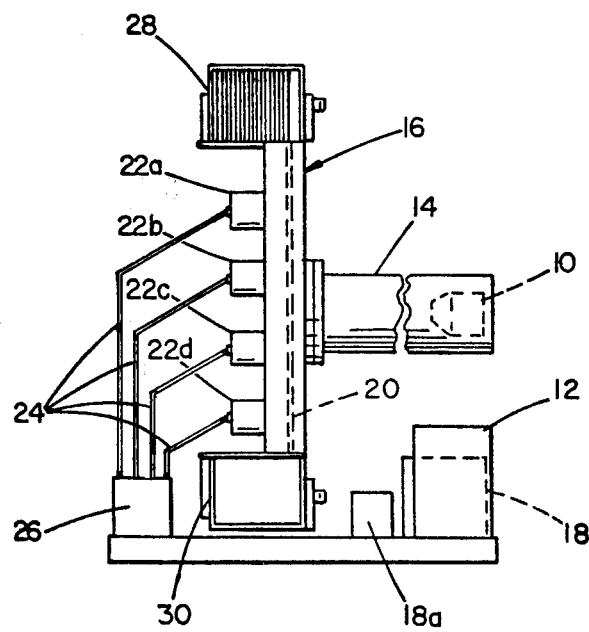
FIG. 3A is a view similar to FIG. 3 of the embodiment of FIG. 2A.

A wafer supply tray 28 is supported at the upper end of the target chamber unit 16. Indexing means 27 provide sequenced indexing of the tray 28 to supply, at appropriate intervals, a fresh wafer to the upper, or entry end of slot 20. A wafer receiving tray 30 is supported at the lower end of the unit 16 for similar indexed motion to receive treated wafers from the lower, or exit, end of the slot 20. Each of the wafers may be retained in an individual correspondingly formed holder as it is supplied from tray 28, proceeds through the slot 20, and is ultimately deposited in the tray 30. The slot 20 is sized to receive the item for transit through the slot 20 in an edgewise fashion, sliding on the lower surface 32 of the slot 20 in the embodiment of FIGS. 2, 3, and 4 and dropping vertically through the slot 20 in the embodiment of FIGS. 2a and 3a. In each embodiment the slot 20 has a cross sectional size and shape that assure edgewise movement of the item as guided by the slot surfaces.

The vacuum barriers or seals A-D will now be described with reference to FIGS. 5A-B, 6, and 8A-C. At the seal location along the slot 20, an opening 34 is provided in plate 17b which defines one wall 36 of the slot. As seen in FIGS. 5A and 8B, a groove 38 is provided in plate 17a which defines the other wall 40 of the slot. Both the opening 34 and the groove 38, which is centered with respect to the opening 34, extend across the widest transverse dimension (i.e., the height $h$ as viewed in FIG. 4) of the slot 20 and terminate beyond the upper and lower surfaces $s_u$ and $s_l$, of slot 20. As shown in FIGS. 8B and 8C, end slots 43, of depth $d$, are provided in plates 17a and 17b beyond slot surfaces $s_u$ and $s_l$. The opening 34 and the groove 38 define a series of edges 42, 44, 46, 48 (FIG. 5A) which are constituents of a sealing margin bounding the slot at the seal locations A-D.

A sealing member 50 is disposed within the opening 34 for motion from a retracted, nonobstructing position (FIG. 5A) to a sealing, channel-obstructing position (FIG. 5B). The member 50, in this preferred embodiment, consists of an elongated rubber cylinder having a diameter, $d$, (see FIG. 8A) substantially equal to the width, $w$, of opening 34, and a radius greater than the thickness of slot 20 (i.e., the perpendicular separation of walls 36 and 40). The member 50 is longer than the height, $h$, of the slot 20 and, thus, extends beyond the slot surfaces $s_u$ and $s_l$ and into end slots 43 (see FIG. 8C). The member 50 is mounted on a backing or support member 52 (e.g., by rubber cement, by an internal recess in the member 50 receiving a projection of the member 52, etc.). The member 52 extends at least a major portion of the length of the member 50 to provide uniform support for the member 50. A piston 54 is attached to the support 52 at the center thereof. Struts 56 extend from the piston 54 to regions of the member 52 spaced apart from its center for distribution of forces over the member 52. The piston 54 is extended (as in FIG. 5B) and retracted (as in FIG. 5A) by means of an air bellows 22b of conventional design.

Figure 7A:
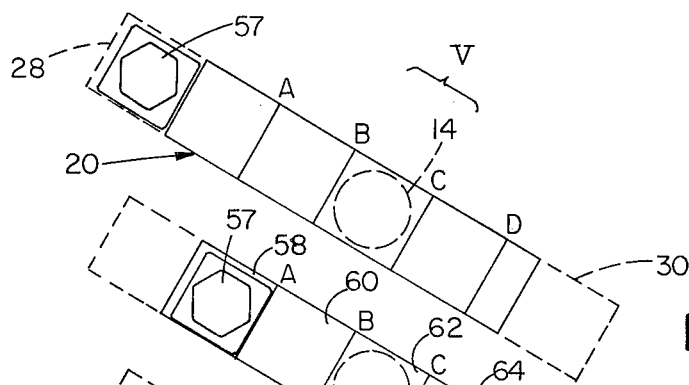
FIGS. 7A through 7I are diagrammatic illustrations of the operating sequence of the ion implantation machine of FIG. 1.
Figure 7B:
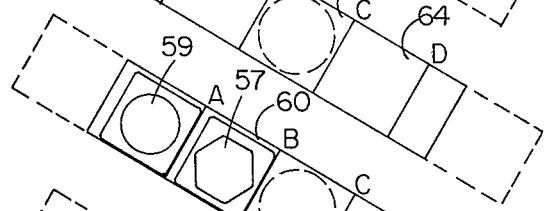
Figure 7C:

The sequence of operation of the machine will be described with reference to FIGS. 7A-7I. With a wafer supply tray 28 and a wafer receiving tray 30 in place on the machine, the operation is preferably continuous and automatic, one or more items (wafers or wafer holders carrying wafers) being in the slot 20 of unit 16 at any given time. To follow a single item through the entire sequence, however, it is convenient to assume that the unit 16 is initially empty, as illustrated in FIG. 7A. The first action in the sequence is the indexing of the tray 28 so that a particular item 57 becomes aligned with the slot 20. Under the influence of gravity, the item slides into a ready position 58 in the slot 20 (see FIG. 7B), where it rests against resilient seal member 50 of the first seal A, which is in the sealing position of FIG. 5B.

Next, unit 26 causes seal A (and seal D) to open long enough for a wafer item 57, which is resting against seal A, to slide past seal A under the influence of gravity. The wafer item 57 thus moves to the position of FIG. 7C, in which it rests against member 50 of seal B. It is now located in the entry vacuum lock 60 portion of channel 20, defined by seals A and B, and above the vacuum, or target, chamber 62, defined by seals B and C. After the appropriate time lag, seals A and D are closed to provide vacuum-tight barriers across the slot 20. (As discussed below in connection with FIGS. 7H and 7I, the operation of seal D simultaneously with A is of benefit when more than one wafer is within unit 16 at a given time.)

As soon as entry and exit locks 60 and 64 are sealed, a roughing vacuum pump (18a of FIG. 1) evacuates the locks. Simultaneously, control 12 actuates the ion source 10 to implant ions in a wafer, if any, which precedes wafer item 57 in the target chamber 62. A conventional sensor (such as a finger contact) may be provided in the target chamber 62 to prevent the actuation of the ion source 10, when, as here, there is no wafer in the chamber 62. Also simultaneously, trays 28, 30 are indexed again so that another wafer item 59 from tray 28 drops into position 58. After a specified degree of vacuum (e.g., 50 microns of mercury) has been attained in the locks 60 and 64 and, as well, after the implantation of ions in a wafer, if any, in chamber 62 has been completed, seal C is opened to permit a wafer, if any, in chamber 62 to pass to exit lock 64. The seal C then closes forming again a vacuum barrier.

Figure 7D:
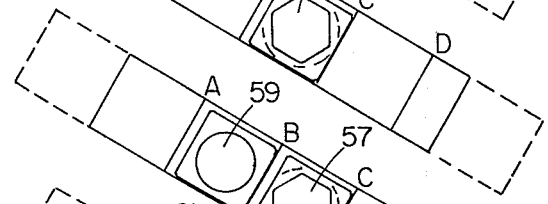
Figure 7E:
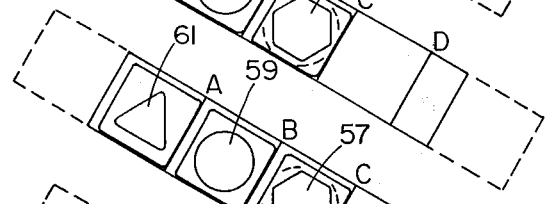
Figure 7F:
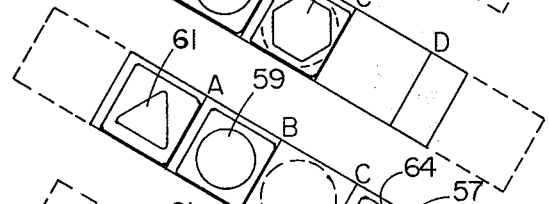
Figure 7G:
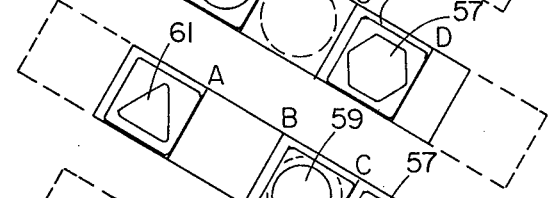

Almost immediately thereafter seal B is opened permitting wafer item 57 to move under the influence of gravity from entry lock 60 to target chamber 62 (see FIG. 7D). Seal B then closes and forms a vacuum barrier between entry lock 60 and chamber 62. This completes a full cycle in the operation of unit 16. Since the operation is continuous, however, the sequence of events is repeated. Thus, with the condition shown in FIG. 7D, seals A and D again open permitting wafer item 59 in position 58 to slide into entry lock 60 and a wafer item, if any, in the exit lock 64 to slide out of the unit 16 and into an aligned slot in the receiving tray 30. The condition will then be as shown in FIG. 7E. Trays 28, 30 will then index so that a fresh wafer item 61 will slide into the ready position, as shown in FIG. 7F, and a vacant slot in receiving tray 30 will be aligned with the slot 20.

Figure 7H:
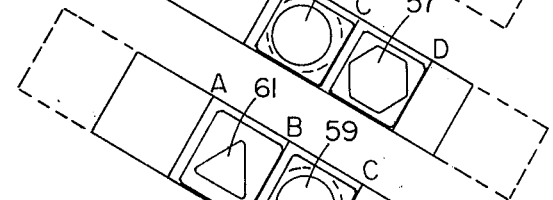
Figure 7I:
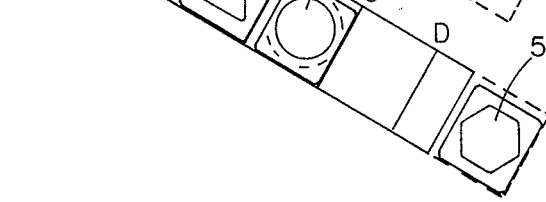

Once again roughing vacuum pump is activated and the ion beam scan is commenced, this time with the wafer item 57 in the target chamber. After implantation is completed, and the appropriate level of vacuum exit lock 64 has been attained, seal C opens permitting wafer item 57 to fall into exit lock 64. Seal C then closes, resulting in the disposition of wafer items shown in FIG. 7G. Seal B then opens to permit the passage of a wafer item 59 in lock 60 into target chamber 62. Seal B then closes, with the wafer items disposed as shown in FIG. 7H. Seals A and D again open, permitting the original wafer item 57 to fall from exit lock 64 into the waiting slot in receiving tray 30 and also permitting the next wafer item 61 in the ready position 58 to slide into entry lock 60, as shown in FIG. 7I.

It is well within the skill of the art to provide the appropriate control apparatus to achieve the sequence outlined above. It should also be noted that appropriate supply lines, and sequenced valves, may be provided to flush each of the locks 60, 64 with nitrogen during the period that the seals A and D are opened.

From the foregoing, it will be apparent to those skilled in the art that the invention facilitates the automatic, rapid, and convenient treatment of discrete items in a chamber which may be of extremely limited volume and therefore requiring a minimum of evacuation or exchange of atmosphere. The seals provide for high speed and reliable operation, adequate vacuum retention, and, as well, can function as a stop for the wafer-form items.

While particular preferred embodiments of the invention have been illustrated in the accompanying drawings and described in detail herein, other embodiments are within the scope of the invention and the following claims.

I claim:

1. In a machine for treating discrete wafer-form items in a vacuum, the machine including a target station for exposing a succession of said wafer-form items to a treatment beam and a lock system for introducing and removing said items relative to the target station, the improvement wherein said lock system and target station are defined by successive portions of an elongated slot-shaped channel disposed with its axis at an elevation to the horizontal through which said items proceed edgewise while aligned by surfaces of said channel, said channel having an elongated cross-section throughout its length larger in each dimension than the cross-section of said wafer-form items thereby enabling unconstrained edgewise gravity movement of said wafer-form items to successive positions along said channel while providing a small channel volume to be evacuated, a plurality of spaced apart elongated seal members movable between open and closed positions and each sized in said closed position to span the slot-shaped channel for sealing one part of said channel from another, said seal members arranged to define entry and exit locks, said target station located therebetween, and means for opening and closing said seal members in sequence to permit the movement of an item along said channel successively past a first seal member into said entry lock, thence past a second seal member to the target station, thence past a third seal member into said exit lock, thence past a fourth seal member out of said machine.

2. The machine of claim 1 wherein said channel is sloped at an acute angle to the horizontal, downwardly from entry to exit locks, the bottom of said channel defining a surface down which said items can progress under the influence of gravity between the respective portions of said channel.

3. The machine of claim 1 wherein said seal members disposed along said channel define stops for positioning said items.

4. The machine of claim 1 comprising an ion implantation machine for said wafer form items, said machine including means for producing an ion beam directed to said target station, the axis of said beam set an at angle slightly off-set from perpendicular to the plane of said elongated slot-shaped channel thereby to cause ions to strike said wafer-form items at a corresponding angle.

5. The machine of claim 1 wherein said channel is formed by a pair of mating plates, the mating face of at least one of said plates having formed therein an elongated slot-form depression.

6. In a machine for treating discrete wafer-form items in a vacuum, the machine including a target station for exposing wafer-form items to a treatment beam and means for introducing a succession of said items to said target station including a vacuum lock in the form of a slot-shaped channel disposed with its axis at an angle to the horizontal to cause said items to proceed edgewise therethrough by gravity movement, said channel having a cross-section throughout its length larger in each dimension than the cross-section of said wafer-form items thereby enabling edgewise movement of said wafer-form items along said channel to said target station while providing a small channel volume to be evacuated, said lock including a pair of seals spaced apart along said channel each movable between open and closed positions and each sized in said closed position to close the slot-shaped channel for sealing, means for opening and closing said seals in sequence thereby to admit a wafer-form item by gravity movement from the atmosphere to a position between the seals and thereafter deliver said item by gravity movement to said target station, and wherein said seal comprises a resilient member sized in closed position to span said slot-shaped channel and resiliently seal against exposed surfaces bounding said channel, said seal member being elongated, having a length at least as long as the widest dimension of the transverse cross-section of said slot-form channel, said seal member disposed to move through an opening of corresponding dimension in one wide wall bounding said channel, to squeeze against the opposed wall of said channel, thereby to close said slot-form channel.

7. The machine of claim 6 wherein at least one of said seals comprises, in its closed position, a stop for obstructing the gravity movement of a wafer-form item, and effective when opened to release said wafer-form item for further gravity movement along said channel.

8. In a machine for treating discrete wafer-form items in a vacuum, the machine including a target station for exposing wafer-form items to a treatment beam and means for removing a succession of said items from said target station including a vacuum lock in the form of a slot-shaped channel disposed with its axis at an angle to the horizontal to cause said items to proceed edgewise therethrough by gravity movement, said channel having a cross-section throughout its length larger in each dimension than the cross-section of said wafer-form items thereby enabling edgewise movement of said wafer-form items along said channel from said target station while providing a small channel volume to be evacuated, said lock including a pair of seals spaced apart along said channel each movable between open and closed positions and each sized in said closed position to close the slot-shaped channel for sealing, and means for opening and closing said seals in sequence thereby to admit a wafer-form item by gravity movement from said target chamber to a position between the seals and thereafter deliver said item by gravity movement to the atmosphere, and wherein said seal comprises a resilient member sized in closed position to span said slot-shaped channel and resiliently seal against exposed surfaces bounding said channel, said seal member being elongated, having a length at least as long as the widest dimension of the transverse cross-section of said slot-form channel, said seal member disposed to move through an opening of corresponding dimension in one wide wall bounding said channel, to squeeze against the opposed wall of said channel, thereby to close slot-form channel.

9. The machine of claim 8 wherein at least one of said seals comprises, in its closed position, a stop for obstructing the gravity movement of a wafer-form item, and effective when opened to release said wafer-form item for further gravity movement along said channel.

* * * * *